(12) United States Patent
Laermer et al.

(10) Patent No.: US 6,926,844 B1
(45) Date of Patent: Aug. 9, 2005

(54) PLASMA ETCHING METHOD HAVING PULSED SUBSTRATE ELECTRODE POWER

(75) Inventors: Franz Laermer, Weil der Stadt (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 292 days.

(21) Appl. No.: 09/889,838

(22) PCT Filed: Oct. 10, 2000

(86) PCT No.: PCT/DE00/03545

§ 371 (c)(1),
(2), (4) Date: Jan. 24, 2002

(87) PCT Pub. No.: WO01/39261

PCT Pub. Date: May 31, 2001

(30) Foreign Application Priority Data

Nov. 27, 1999 (DE) ................................. 199 57 169

(51) Int. Cl.$^7$ ............................................. C23F 7/00
(52) U.S. Cl. .......................................... 216/67; 216/79
(58) Field of Search ................... 156/345.28; 216/67, 216/79; 315/271, 351; 438/710, 714

(56) References Cited

FOREIGN PATENT DOCUMENTS

| DE | 42 41 045 | 5/1994 |
|---|---|---|
| DE | 197 06 682 | 8/1998 |
| DE | 199 19 832.2 | 11/2000 |
| DE | 199 33 842.6 | 2/2001 |
| JP | 06 342770 | 12/1994 |
| JP | 09 232738 | 9/1997 |
| JP | 10 074730 | 3/1998 |

*Primary Examiner*—Allan Olsen
(74) *Attorney, Agent, or Firm*—Kenyon & Kenyon

(57) ABSTRACT

A method is proposed for etching patterns in an etching body (18), in particular cut-outs in a silicon body (18) exactly defined in a lateral manner, using a plasma (14). In this context, a high-frequency-pulsed high-frequency power is at least temporarily coupled into the etching body (18) via an at least temporarily applied high-frequency a.c. voltage. This coupled, high-frequency-pulsed high-frequency power is further modulated at a low frequency, in particular clocked. The proposed method opens a wide process window for varying the etching parameters in the implemented plasma etching process, and is especially suitable for etching patterns in silicon using high mask selectivity and high etching rates for simultaneously minimized charge effects, in particular with respect to notching on the dielectric boundary surface.

38 Claims, 3 Drawing Sheets

PLASMA ETCHING METHOD HAVING PULSED SUBSTRATE ELECTRODE POWER

FIELD OF THE INVENTION

The present invention relates to a method for etching patterns in an etching body using a plasma.

BACKGROUND INFORMATION

Anisotropic plasma etching methods are known, for example, from German Patent No. 197 06 682 A1 or German Patent No. 42 41 045 C2, in which, in each case, a plasma of neutral radicals and electrically charged particles is produced via a high-density plasma source, the particles being accelerated by a bias voltage source in the direction of a substrate electrode carrying the wafer to be processed. In this context, a directed etching process is achieved by the preferential direction of the incident ions.

Furthermore, high-frequency generators having a carrier frequency of 13.56 MHz are typically used as the bias voltage source that produces the electrical voltage for accelerating the ions from the plasma in the direction of the substrate electrode. In this context, the high-frequency generator is adjusted by an LC network ("matchbox") to both the impedance of the substrate electrode and the plasma that is in contact with the substrate electrode.

Furthermore, under consideration of a good mask selectivity, i.e., the ratio of the silicon etching rate to the etching speed of the masking layer, it is already known to select the high-frequency power on the substrate electrode to be relatively low to keep the ion-supported mask removal as minimal as possible. Typical power values are between 5 watts and 20 watts, so that the energy of the ions incident on the substrate surface is usually several units of 10 eV.

It is true that such low ion energies are advantageous with respect to the mask selectivity. However, as a result, the incident ions can also have a relatively significant degree of scatter with respect to their direction and can partially deviate from the desired, vertical incidence or can be slightly deflected, i.e., their directionality is low. Such deviations in the directionality of the incident ions then correlates to more difficult profile verification of the produced etching profile. Viewed in terms of the directionality of the ion current, high ion acceleration, i.e., high ion energy, would, therefore, be desirable, which, however, conflicts with the necessary mask selectivity.

Furthermore, charging effects often occur on the boundary layer silicon dielectric when using high-density plasmas having low-energy ion action on a substrate in response to impacting upon an etch stop of dielectrics (buried oxides, lacquer layers, etc.). Profile imperfections in the silicon resulting therefrom are referred to as notching on the dielectric interface.

At the same time, as the ion energy increases, so does the danger of so-called "grass formation" on the etching ground, i.e., the process window for a reliable etching process without grass formation is limited. In this context, "grass formation" refers to the nonuniform etching of the etching ground while forming a plurality of closely adjoining points, which take on the shape of grass.

To achieve this objective, the applications German Patent No. 199 33 842.6 and German Patent No. 199 19 832.2 already proposed pulsing the high-frequency a.c. voltage, which is used for producing the substrate bias, i.e., for producing the substrate electrode power to be coupled into the substrate to be etched, and at the same time, selecting the ion energy to be higher during the high-frequency impulses than for continuous wave operation.

However, during this pulse control operation, it is observed that an effective suppression of the notching is first achieved in response to relatively long interval times of 0.1 ms to 1 ms between the applied high-frequency impulses. If the pulse intervals are shortened to under 0.1 ms, notching occurs more frequently and cannot be suppressed by increasing the peak pulse power and correspondingly shortening the pulse duration.

Moreover, for long interval times of 0.1 ms to 1 ms, the process window for a reliable process, i.e., a grass-free etching ground, narrows in response to the pulse time being shortened with a corresponding increase in the peak pulse power, i.e., the etching process becomes increasingly notch-resistant, but the suppression of a grass-free etching ground becomes increasingly smaller. To date, this requirement for a "notch-resistant" process, therefore, conflicts with a "grass-resistant" process.

In this context, the process window refers to process parameter ranges suitable for implementing an etching process, which is reliable in the explained manner, in particular with respect to process pressure, substrate electrode power, plasma power, and gas flows, as well as, in some instances, the cycle times for alternating etching cycles and passivation cycles.

On the whole, in the known methods under the marginal conditions of a "grass-free" etching ground and a sufficient suppression of "notching," the employable high-frequency peak pulse powers and, as such, the ion energies, i.e., the directionality of the ion incidence, is, therefore, restricted, thereby resulting, to date, in the process window, i.e., the usable process parameters, being restricted in an undesired manner.

Due to the grass formation, this restriction of the process window has a particularly disruptive effect when high-rate etching processes are to be carried out, since, as such, the range of allowable process pressures is restricted in an upward direction. On the other hand, it is exactly high pressures, high gas flows, and high plasma powers at the inductive source that are advantageous for achieving high etching rates.

SUMMARY OF THE INVENTION

In comparison with the related art, the plasma etching method according to the present invention has the advantage that with this method, the pulse times and interval times of the coupled, high-frequency-pulsed high-frequency power can be significantly shortened, and pulse operation having a high repetition rate in the 100 kHz range can be implemented.

At this high repetition frequency, the peak pulse power can now also be advantageously increased or scaled up in inverse proportion to the mark-to-space ratio.

At the same time, in addition to the notching (notching effects) being effectively suppressed, a very stable and robust process is achieved that does not have a tendency to form "grass" on the etching ground in response to the process parameters being varied within a wide process window.

Furthermore, in the method according to the present invention, very high-frequency peak powers can now be used for accordingly short pulse durations, i.e., an accordingly small mark-to-space ratio and/or pulse duty factor. Advantageously, the result is a correspondingly high ion energy of typically 50 eV to 1000 eV, which is associated with very good directionality of the ion incidence.

In this context, one takes advantage of the fact that, in response to using short pulses having a high rate of repetition, the time averaging of the power values takes place over a tight sequence of short-time pulses from which every individual pulse represents only one relatively low energy input to the etching body. On the whole, this leads to a high level of process stability.

In opposition to the relatively long pulses having relatively long intervals in which the energy is already so high in a single pulse that interference effects occur in the electrode-plasma interaction during one single pulse, it is advantageously no longer observed in the method according to the present invention that shortening the pulse durations and correspondingly increasing the peak pulse power requires an increase in the average power necessary for etching input into the substrate electrode and the etching body, respectively. Rather, the pulse duty factor and the necessary peak pulse power are now effectively scaled in inverse proportion to one another.

On the whole, as a result of the high-frequency pulsing of the high-frequency power pulses, interference effects in the plasma-substrate electrode interaction are effectively suppressed, so that for a given frequency of the high-frequency generator, e.g. 13.56 MHz, and for a given, average high-frequency power coupled into the etching body, the ion energy and correspondingly the average ion current onto the etching body can be freely selected.

When P refers to the average high-frequency power, which is coupled into the etching body and is to be kept constant for a specific etching process, p refers to the peak pulse power and/or amplitude of the high-frequency power in a pulse, d refers to the pulse duty factor, u refers to the ion acceleration voltage corresponding to the energy of the ions impinging on the etching body, i refers to the pulsed ion current, and I refers to the temporal average value of the ion current, the following applies for the process according to the present invention:

$$p = \frac{P}{d} \quad u = \sqrt{X\frac{P}{d}} \propto \sqrt{\frac{1}{d}} \quad i = \sqrt{\frac{1}{X}\frac{P}{d}} \quad I = \sqrt{\frac{1}{X}Pd} \propto \sqrt{d}$$

In this context, it is assumed that plasma impedance X only changes minimally with the coupled high-frequency power and, therefore, approximates Ohm's law. In practice, due to the saturation effects of the ion current and to limited, available ion densities in the plasma, plasma impedance X increases even more as the coupled high-frequency power increases, thereby intensifying the described effect.

On the whole, the method according to the present invention, therefore, advantageously results in $$u \propto \sqrt{\frac{1}{d}}$$

applying for energy u of the ions impinging on the wafer in the case of a reduced duty cycle d (or analogously, in the case of a reduced mark-to-space ratio) and of correspondingly scaled-up peak pulse power p, i.e., constant average power P, while average current I behaves according to $I \propto \sqrt{d}$.

Thus, one can freely select via duty cycle parameters d for an equal power input whether a high ion energy having a correspondingly low average ion current or a low ion energy having a correspondingly high average ion current should be set. One is, therefore, afforded an additional degree of freedom in the etching process according to the present invention whose effect corresponds to an adjustability of the plasma impedance, and which can be used to widen the process window, e.g. for high-rate etching processes.

The method according to the present invention has the further significant advantage that, in addition to a high-frequency-pulsed high-frequency power, which is used for process stability in a wide process window and for suppressing grass formation controllable via the characteristic quantities, ion energy, and average ion current, and which also leads to high etching rates, notching on the dielectric boundary surfaces can also be effectively suppressed by the additional low-frequency modulation of the high-frequency-pulsed high-frequency power.

This low-frequency modulation is based on the knowledge that relatively long times of typically more than 0.5 ms are necessary for reducing the charging effects on these dielectric boundary surfaces. The result is a frequency range for the low-frequency modulation of 10 Hz to 10000 Hz, preferably of 50 Hz to 1000 Hz.

The method according to the present invention is, therefore, suited in a particularly advantageous manner for a notching-resistant, high-rate etching process in the case of an increased process pressure of 20 Mbar to 300 Mbar, for example, and a high plasma power of up to 5000 watts.

It is particularly advantageous that also in the case of a small mark-to-space ratio of 1:9 through 1:19, for example, and correspondingly high peak pulse powers of the coupled high-frequency power pulses of 100 watts to 200 watts, a wide process window is retained with regard to the danger of grass forming.

It is further advantageous that conventional high-frequency generators can be operated in such a manner that a high-frequency pulsing of the coupled high-frequency power is possible in the form of rectangular pulses, the rise times of the clock pulse edges being less than 0.3 µs in the case of a carrier frequency of 13.56 MHz. As such, the method according to the present invention can be advantageously implemented using commercially available generators, which, in some instances, may require only minor modifications.

Such a short rise time of the clock pulse edges is necessary to even be able to implement a high-frequency power pulsing having a frequency of 10 kHz to 500 kHz.

For the peak pulse power, i.e., the amplitude of the high-frequency power during a coupled high-frequency power pulse, further advantageous powers of 30 watts to 1200 watts can be used.

Furthermore, to produce the low-frequency modulation of the high-frequency-pulsed high-frequency power, two alternative possibilities are advantageously available. On the one hand, the high-frequency generator integrated in the generator unit and already clocked at a high frequency can, for example, additionally be directly switched on and off using low-frequency clocking via the generator's gate input.

On the other hand, there is also the possibility to use a low-frequency clock generator to control a high-frequency clock generator, which is integrated in the generator unit and modulates the actual carrier signal of the high-frequency generator, thereby causing the high-frequency pulsing of the high-frequency power. In this manner, the high-frequency clock generator is keyed in and blanked at a low frequency, which also correspondingly carries over to the coupled high-frequency power pulses.

DETAILED DESCRIPTION

Figure 2:
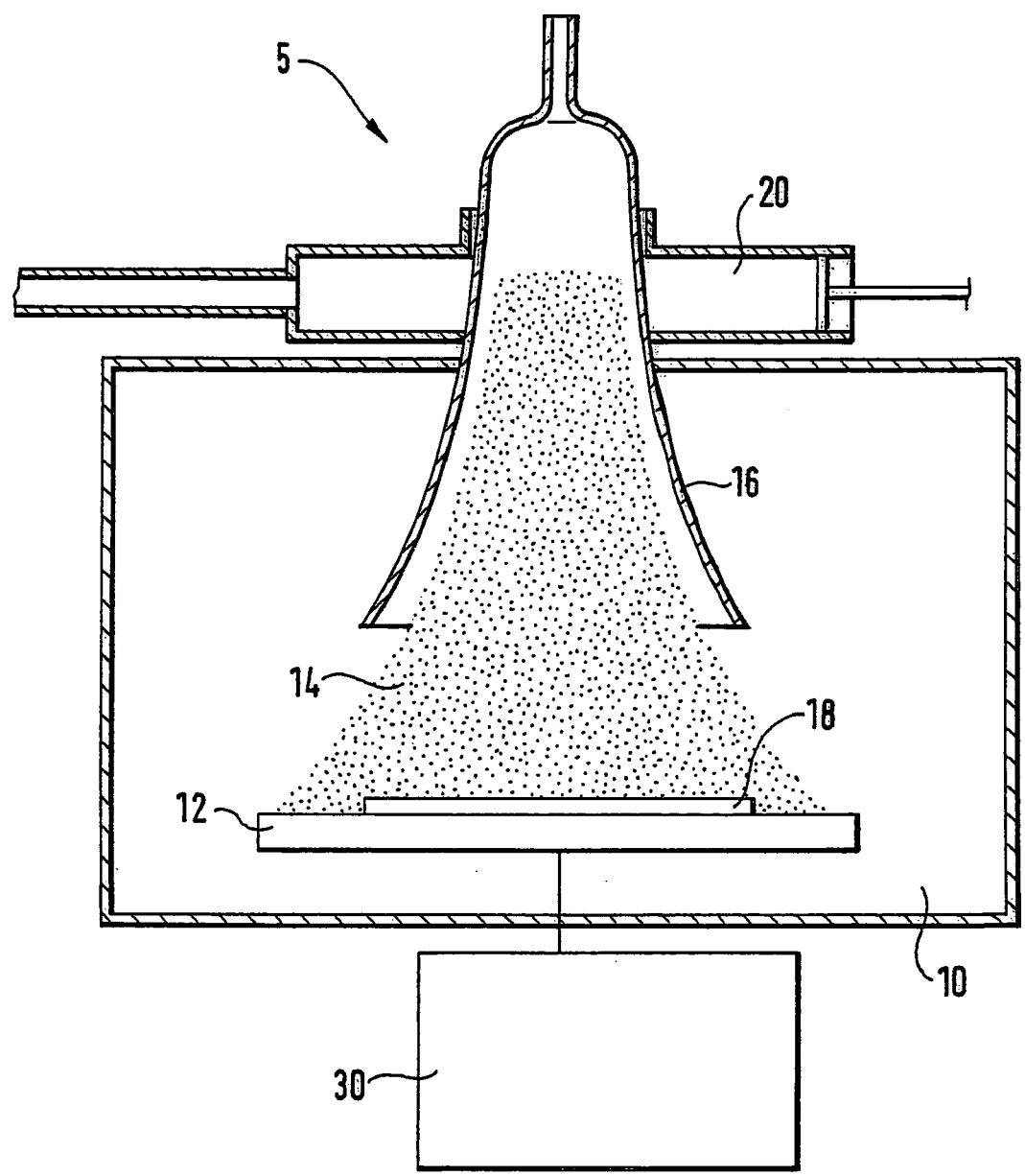
FIG. 2 shows a block diagram of an etching system for implementing the etching method.

FIG. 2 shows a plasma etching system 5 principally known from German Patent No. 42 41 045 C2 or German Patent No. 197 06 682 A1, for implementing an anisotropic plasma etching method. For this purpose, a substrate electrode 12 is provided in an etching chamber 10 with an etching body 18, which is situated on the substrate electrode and is a silicon wafer in the explained example. Furthermore, substrate electrode 12 is electrically connected to a generator unit 30. Moreover, a resonator 20 is provided via which a plasma 14 is produced in etching chamber 10 in the region of a surfatron 16. The explained exemplary embodiment is, however, not limited to such a system configuration. In particular, an ICP plasma source (inductively coupled plasma) or an ECR plasma source (electron cyclotron resonance) is also suitable for this purpose.

A high-density plasma source produces a plasma 14, which is made of neutral radicals and electrically charged particles (ions), the ions being accelerated by a high-frequency power coupled into substrate electrode 12 and, above it, into etching body 18 in the direction of substrate electrode 12, which carries the etching body 18 to be processed, and impacting there in an almost vertical manner, so that the preferential direction of the incident ions results in a directed etching process.

Generator unit 30 has a commercially available high-frequency generator 33, a high-frequency clock generator 32, a low-frequency clock generator 31, and a so-called "matchbox" 34, i.e., an LC network. In this context, matchbox 34 is used in a known manner to adapt high-frequency generator 33 to the impedance of substrate electrode 12 and plasma 14, which is in contact with substrate electrode 12.

To ensure an effective mask selectivity (ratio of the etching rate of etching body 18 to the etching speed of a masking layer disposed thereon), a time-averaged high-frequency power of 1 watt to 30 watts is coupled into substrate electrode 12 via generator unit 30.

To produce the high-frequency-pulsed high-frequency power coupled into substrate electrode 12 and, above it, into etching body 18, it is first proposed that high-frequency generator 33 produce in generator unit 30 a high-frequency carrier signal 54 having a frequency of preferably 13.56 MHz and a power of 400 watts, for example. However, frequencies of 1 MHz to 50 MHz are also possible instead of the carrier signal frequency of 13.56 MGz. Furthermore, the power of high-frequency generator 33 can also be between 30 watts and 1200 watts. Powers between 50 watts and 500 watts are preferred.

Figure 1A:
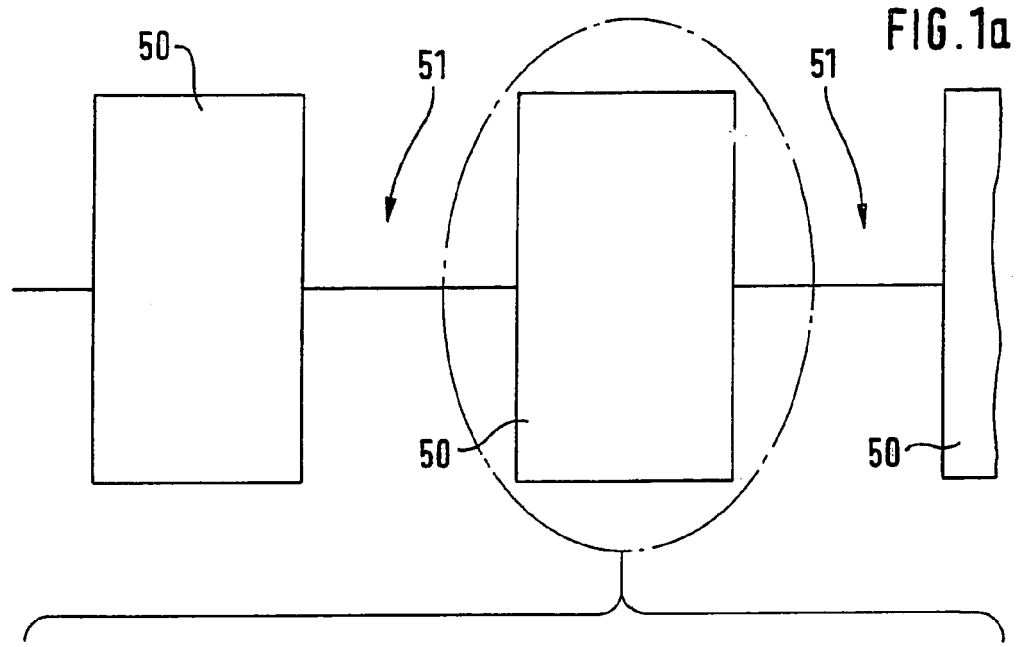
FIGS. 1a, 1b, and 1c explain the pulses of the high-frequency power coupled into the etching body.
Figure 1B:
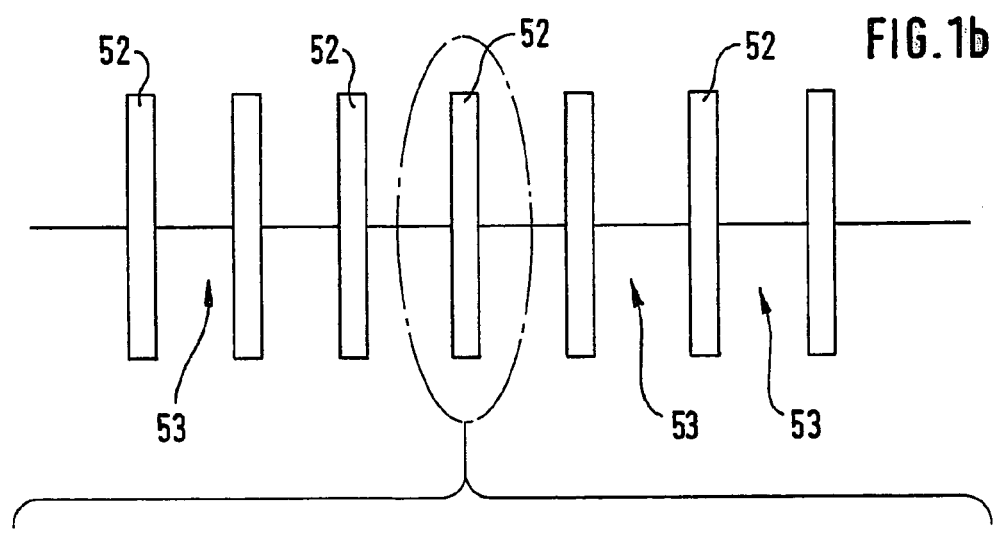
Figure 1C:
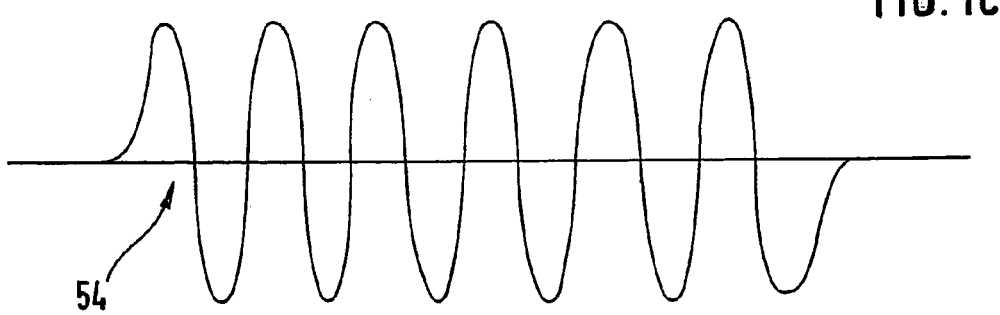
Figure 3A:
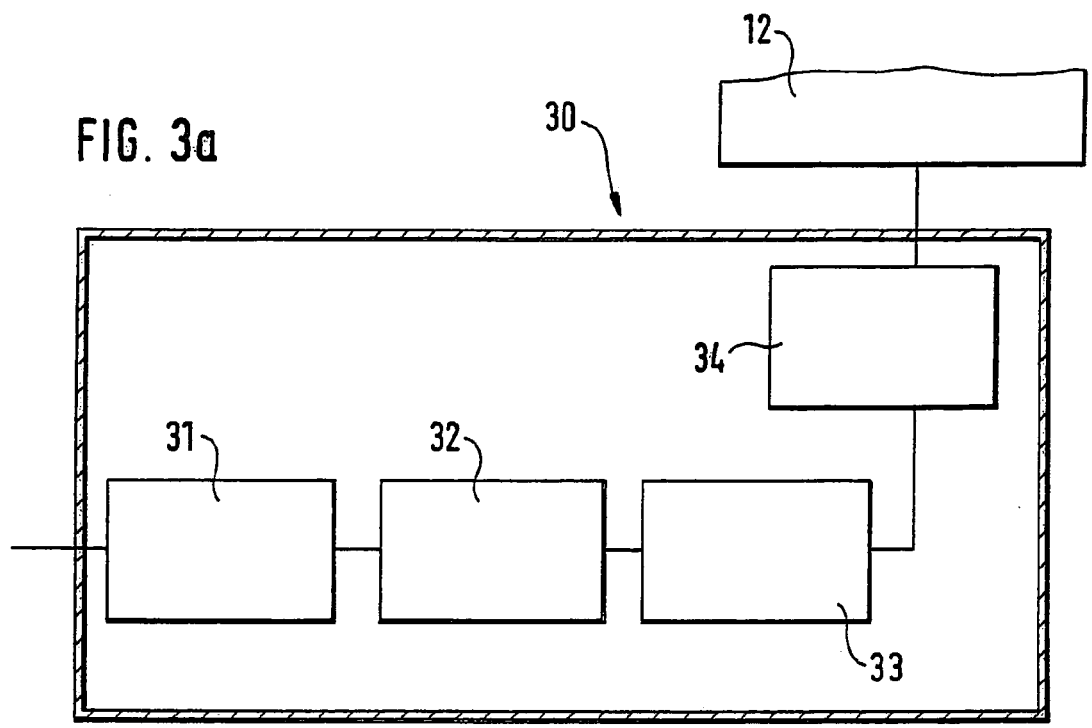
FIGS. 3a and 3b explain two alternative specific embodiments of the generator unit.

In a first exemplary embodiment of the present invention, it is further provided in accordance with FIG. 3a that, in addition to high-frequency generator 33 and matchbox 34, generator unit 30 has a high-frequency clock generator 32, which controls high-frequency generator 33 in such a manner that high-frequency generator 33 produces a high-frequency-pulsed high-frequency power. This is elucidated using FIGS. 1c and 1b. In detail, FIG. 1c shows high-frequency carrier signal 54 of high-frequency generator 33 having a frequency of 13.56 MHz, for example, and a voltage amplitude corresponding to a power of 400 watts, for example. According to FIG. 1b, pulsing high-frequency generator 33 using high-frequency clock generator 32 produces high-frequency pulses 52, each of which is followed by a high-frequency pulse interval 53. Carrier signal 54 of high-frequency generator 33 is clocked by high-frequency clock generator 32 using a frequency of 10 kHz to 500 kHz, preferably 50 kHz to 200 kHz. The mark-to-space ratio of the high-frequency-pulsed high-frequency power according to FIG. 1b is between 1:1 and 1:100. A ratio between 1:2 and 1:19 is especially preferred.

A high-frequency power of 1 watt to 100 watts, time-averaged over pulses and intervals is first produced by the selected mark-to-space ratio of the high-frequency-pulsed high-frequency power, starting from the produced power of high-frequency generator 30.

According to FIG. 3a, generator unit 30 further has a low-frequency clock generator 31, which periodically switches high-frequency clock generator 32 on and off and/or clocks it. In this manner, the high-frequency-pulsed high-frequency power according to FIG. 1b is also modulated at a low frequency. For this purpose, low-frequency clock generator 31 specifically clocks high-frequency clock generator 32 with a frequency of 10 Hz to 10000 Hz. Frequencies of 50 Hz to 1000 Hz are preferred. On the whole, clocking at a low frequency or modulating at a low frequency with the aid of low-frequency clock generator 31 causes the coupled, pulsed high-frequency power to be periodically switched on and off into substrate electrode 12 and, above it, into etching body 18. In this context, the mark-to-space ratio of the low-frequency clocking of low-frequency clock generator 31 according to FIG. 1a, i.e., the ratio of low-frequency pulses 50 and low-frequency pulse intervals 51, is between 4:1 and 1:4. It has proven to be particularly advantageous when the mark-to-space ratio of the low-frequency clocking is between 1:2 and 2:1, e.g. 1:1.

As a result of the low-frequency clocking of the high-frequency-pulsed high-frequency power according to FIG. 1b, the high-frequency power ultimately coupled into etching body 18 is reduced in accordance with the particular mark-to-space ratio (FIG. 1a), so that a typical high-frequency power between 1 watt and 30 watts is ultimately coupled into etching body 18.

With respect to the envelope, high-frequency pulses 52 according to FIG. 1b preferably at least approximate the form of a square-wave pulse, the rise time of the clock pulse edges of the square-wave pulses being less than 0.3 $\mu$s.

One can easily connect low-frequency clock generator 31 to a system control (not shown) and use the system control to control the average high-frequency power coupled into etching body 18 during the course of the implemented etching process. The mark-to-space ratio of the low-frequency clocking is particularly suitable for this purpose. The mark-to-space ratio of the high-frequency-pulsed high-frequency power according to FIG. 1b is particularly suitable for optimizing the process with respect to the aforementioned grass formation. Of course, it is also possible to maintain the mark-to-space ratio of the low-frequency clocking, and to regulate the peak pulse power of the generator to control the average power.

Figure 3B:
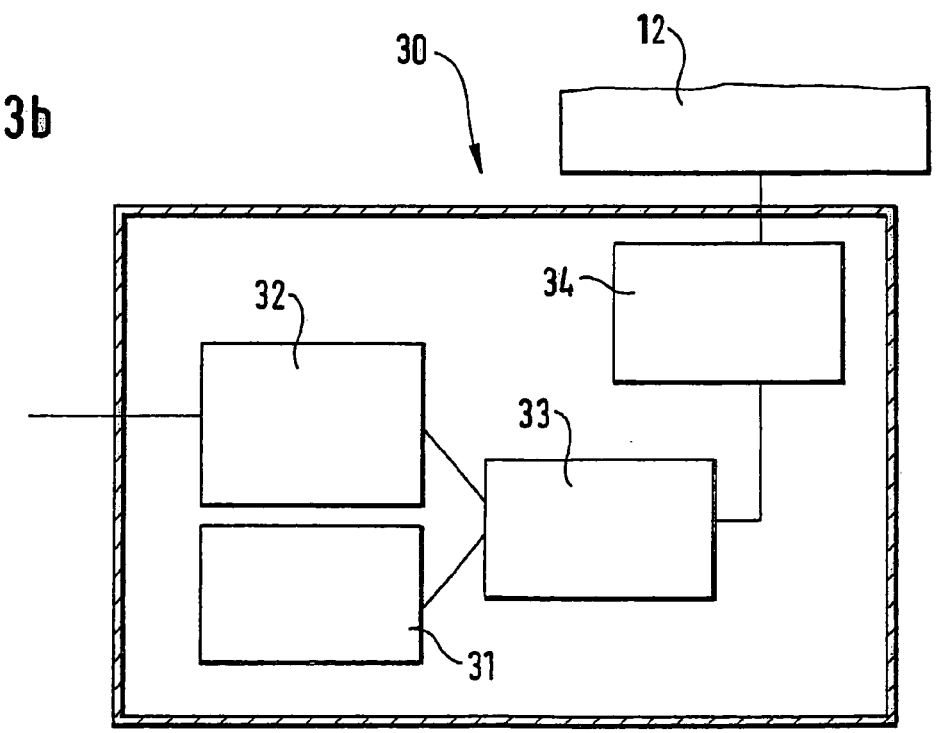

As an alternative to FIG. 3a, FIG. 3b elucidates a specific embodiment of generator unit 30 for producing a high-frequency-pulsed high-frequency power, which modulates at a low frequency. For this purpose, according to FIG. 3b, high-frequency generator 33 is first clocked at a high frequency, analogously to FIG. 3a, via a high-frequency clock generator 32, so that it generates a high-frequency-pulsed high-frequency power according to FIG. 1b. In contrast to FIG. 3a, FIG. 3b provides that low-frequency clock generator 31 does not control high-frequency clock generator 32, but is directly connected to and also directly clocks high-frequency generator 33. A circuit arrangement according to FIG. 3b can be particularly simply produced by connecting low-frequency clock generator 31 to the gate input of customary high-frequency generators 33, which are additionally clocked at a high frequency, e.g. via an internal clock generator or external clock generator 32. The remaining method parameters for implementing the etching method according to FIG. 3b correspond to the method according to FIG. 3a and FIGS. 1a through 1c, respectively.

In an overview, FIGS. 1a through 1c again clarify the high-frequency-pulsed high-frequency power coupled into etching body 18 and provided with a low-frequency modulation. For this purpose, FIG. 1c, i.e., high-frequency carrier signal 54 of high-frequency generator 33, is first used as a baseline. According to FIG. 1b, this carrier signal 54 is subdivided by high-frequency clock generator 32 into high-frequency pulses 52 and high-frequency pulse intervals 53. In this context, high-frequency pulses 52 are ideally at least approximately in the form of square-wave pulses (envelope) and are formed by carrier signal 54. FIG. 1a then clarifies how the high-frequency-pulsed high-frequency power coupled into etching body 18 is clocked and/or modulated at a low frequency with the aid of low-frequency clock generator 31. For this purpose, a plurality of high-frequency pulses 52 and high-frequency pulse intervals 53, respectively, are combined into low-frequency pulses 50, which are then each followed by a low-frequency pulse interval 51. As the envelope, low-frequency pulses 50 are preferably also in the form or square-wave pulses. The signal according to FIG. 1a is then coupled into etching body 18 via substrate electrode 12 as high-frequency power.

What is claimed is:

1. A method for etching a pattern in an etching body in accordance with a plasma, comprising the steps of:
    coupling at least temporarily a high-frequency-pulsed high-frequency power into the etching body via an at least temporarily applied high-frequency a.c. voltage; and
    modulating the coupled, high-frequency-pulsed high-frequency power at a low frequency;
    wherein a mark-to-space ratio of the high-frequency-pulsed high-frequency power is between 1:2 and 1:100.

2. The method of claim 1, wherein:
    the etching pattern is a cut-out,
    the etching body is a silicon body, and
    the cut-outs are exactly defined by an etching mask in a lateral manner.

3. The method of claim 1, wherein the high-frequency-pulsed high-frequency-power is coupled in the form of square-wave pulse.

4. The method of claim 1, wherein the mark-to-space ratio of the high-frequency-pulsed high-frequency power is between 1:2 and 1:19.

5. The method of claim 1, wherein a sequence of pulses of the high-frequency-pulsed power and pulse intervals corresponds to an average high-frequency power of 1 watt to 100 watts.

6. The method of claim 1, wherein the coupled, high-frequency-pulsed high-frequency power is periodically modulated using a low-frequency clocking.

7. The method of claim 1, wherein one of a low-frequency clocking and the low-frequency modulation causes the coupled, high-frequency-pulsed high-frequency power to be periodically switched on and off.

8. The method of claim 1, wherein the high-frequency-pulsed high-frequency power is pulsed at a frequency of 10 kHz to 500 kHz.

9. The method of claim 8, wherein the high-frequency-pulsed high-frequency power is pulsed at a frequency of 50 kHz to 200 kHz.

10. The method of claim 1, wherein one of a low-frequency clocking and the low-frequency modulation is performed at a frequency of 10 Hz to 10000 Hz.

11. The method of claim 10, wherein the one of the low-frequency clocking and the low-frequency modulation is performed at a frequency of 50 Hz to 1000 Hz.

12. The method of claim 1, wherein a mark-to-space ratio of a low-frequency clocking is between 4:1 and 1:4.

13. The method of claim 12, wherein the mark-to-space ratio of the low-frequency clocking is between 1:2 and 2:1.

14. The method of claim 1, wherein the at least temporarily applied high-frequency a.c. voltage is provided by a high-frequency generator, the high-frequency generator generating a high-frequency carrier signal.

15. The method of claim 14, wherein the high-frequency carrier signal has a frequency of 1 MHz to 50 MHz.

16. The method of claim 15, wherein the high-frequency carrier signal has a frequency of 13.56 MHz.

17. The method of claim 14, wherein the high-frequency generator generates a high-frequency power having an amplitude of 30 watts to 1200 watts.

18. The method of claim 17, wherein the high-frequency generator generates a high-frequency power having an amplitude of 50 watts to 500 watts.

19. A method for etching a pattern in an etching body in accordance with a plasma, comprising the steps of:
    coupling at least temporarily a high-frequency-pulsed high-frequency power into the etching body via an at least temporarily applied high-frequency a.c. voltage; and
    modulating the coupled, high-frequency-pulsed high-frequency power at a low frequency,
    wherein the high-frequency-pulsed high-frequency power is coupled in the form of square-wave pulses; and
    wherein the square-wave pulses have a rise time of clock pulse edges of the square-wave pulses of less than 0.3 $\mu s$.

20. A method for etching a pattern in an etching body in accordance with a plasma, comprising the steps of:
    coupling at least temporarily a high-frequency-pulsed high-frequency power into the etching body via an at least temporarily applied high-frequency a.c. voltage; and
    modulating the coupled, high-frequency-pulsed high-frequency power at a low frequency;
    wherein a time-averaged value for the high-frequency-pulsed high-frequency power coupled into the etching body is between 1 watt and 30 watts.

21. The method of claim 20, wherein:
    the etching pattern is a cut-out,
    the etching body is a silicon body, and
    the cut-outs are exactly defined by an etching mask in a lateral manner.

22. The method of claim 20, wherein the high-frequency-pulsed high-frequency power is coupled in the form of square-wave pulses.

23. The method of claim 20, wherein a sequence of pulses of the high-frequency-pulsed power and pulse intervals corresponds to an average high-frequency power of 1 watt to 100 watts.

24. The method of claim 20, wherein the coupled, high-frequency-pulsed high-frequency power is periodically modulated using a low-frequency clocking.

25. The method of claim 20, wherein one of a low-frequency clocking and the low-frequency modulation causes the coupled, high-frequency-pulsed high-frequency power to be periodically switched on and off.

26. The method of claim 20, wherein the high-frequency-pulsed high-frequency power is pulsed at a frequency of 10 kHz to 500 kHz.

27. The method of claim 26, wherein the high-frequency-pulsed high-frequency power is pulsed at a frequency of 50 kHz to 200 kHz.

28. The method of claim 20, wherein a mark-to-space ratio of the high-frequency-pulsed high-frequency power is between 1:1 and 1:100.

29. The method of claim 28, wherein the mark-to-space ratio of the high-frequency-pulsed high-frequency power is between 1:2 and 1:19.

30. The method of claim 20, wherein one of a low-frequency clocking and the low-frequency modulation is performed at a frequency of 10 Hz to 10000 Hz.

31. The method of claim 30, wherein the one of the low-frequency clocking and the low-frequency modulation is performed at a frequency of 50 Hz to 1000 Hz.

32. The method of claim 20, wherein a mark-to-space ratio of a low-frequency clocking is between 4:1 and 1:4.

33. The method of claim 32, wherein the mark-to-space ratio of the low-frequency clocking is between 1:2 and 2:1.

34. The method of claim 20, wherein the at least temporarily applied high-frequency a.c. voltage is provided by a high-frequency generator, the high-frequency generator generating a high-frequency carrier signal.

35. The method of claim 24, wherein the high-frequency carrier signal has a frequency of 1 MHz to 50 MHz.

36. The method of claim 35, wherein the high-frequency carrier signal has a frequency of 13.56 MHz.

37. The method of claim 34, wherein the high-frequency generator generates a high-frequency power having an amplitude of 30 watts to 1200 watts.

38. The method of claim 37, wherein the high-frequency generator generates a high-frequency power having an amplitude of 50 watts to 500 watts.

* * * * *

UNITED STATES PATENT AND TRADEMARK OFFICE
CERTIFICATE OF CORRECTION

PATENT NO. : 6,926,844 B1
DATED : August 9, 2005
INVENTOR(S) : Franz Laermer et al.

It is certified that error appears in the above-identified patent and that said Letters Patent is hereby corrected as shown below:

<u>Title page,</u>
Item [57], ABSTRACT,
Lines 1-2, change "an etching body (18)" to -- an etching body --;
Lines 2 and 5, delete "(18)";
Line 3, change "a plasma (14)" to -- a plasma --;
Lines 3-4, delete "In this context,";
Line 4, change "a high-frequency-pulsed" to -- A high-frequency-pulsed --; and <u>Column 10,</u>
Line 15, change "The method of claim 24" to -- The method of claim 34 --.

Signed and Sealed this

Thirteenth Day of December, 2005

JON W. DUDAS
*Director of the United States Patent and Trademark Office*